(12) United States Patent
Sekimoto et al.

(10) Patent No.: US 8,030,661 B2
(45) Date of Patent: Oct. 4, 2011

(54) POWER CONVERSION APPARATUS

(75) Inventors: Morimitsu Sekimoto, Kusatsu (JP); Hitoshi Haga, Sendai (JP); Kenichi Sakakibara, Kusatsu (JP); Reiji Kawashima, Kusatsu (JP); Abdallah Mechi, Kusatsu (JP); Toshiyuki Maeda, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 200 days.

(21) Appl. No.: 12/439,451

(22) PCT Filed: Aug. 22, 2007

(86) PCT No.: PCT/JP2007/066265
§ 371 (c)(1),
(2), (4) Date: Feb. 27, 2009

(87) PCT Pub. No.: WO2008/026485
PCT Pub. Date: Mar. 6, 2008

(65) Prior Publication Data
US 2009/0256161 A1 Oct. 15, 2009

(30) Foreign Application Priority Data
Aug. 31, 2006 (JP) .................................. 2006-237050

(51) Int. Cl.
*H01L 31/0312* (2006.01)
*H01L 23/52* (2006.01)
*H01L 23/34* (2006.01)

(52) U.S. Cl. ..... 257/77; 257/691; 257/712; 257/E23.08; 257/E29.104

(58) Field of Classification Search ................ 257/691, 257/77, 712, E23.08, E29.104
See application file for complete search history.

(56) References Cited

U.S. PATENT DOCUMENTS

| 5,488,256 A | 1/1996 | Tsunoda |
| 2004/0007772 A1 | 1/2004 | Arai et al. |

FOREIGN PATENT DOCUMENTS

| JP | 4-93159 U | 8/1992 |
| JP | 7-74306 A | 3/1995 |
| JP | 2001-24294 A | 1/2001 |
| JP | 2004-47883 A | 2/2004 |
| JP | 2004-221381 A | 8/2004 |
| JP | 2006-42529 A | 2/2006 |
| JP | 2006-211805 A | 8/2006 |
| JP | 2006-211805 | * 10/2006 |

* cited by examiner

*Primary Examiner* — David S Blum
(74) *Attorney, Agent, or Firm* — Birch, Stewart, Kolasch & Birch, LLP

(57) ABSTRACT

In the case where a chip is made of wide band gap semiconductor, a power conversion apparatus is obtained in which a component having a low heat resistant temperature is prevented from receiving thermal damage by heat generated at the chip. In a configuration including: a chip portion (20) including a chip (21) made of wide band gap semiconductor and a member (22, 23) having a heat resistant temperature equal to or higher than that of the chip (21); and a peripheral component (25) arranged in the vicinity of the chip portion (20) and having a heat resistant temperature lower than that of the chip (21). The chip (21) and the peripheral component (25) are thermally insulated from each other so that the temperature of the peripheral component (25) does not exceed the heat resistant temperature of the peripheral component (25).

16 Claims, 5 Drawing Sheets

(a)

(b)

POWER CONVERSION APPARATUS

CROSS-REFERENCE TO RELATED APPLICATION

This application is a 371 of PCT/JP2007/066265 filed Aug. 22, 2007 and claims priority under 35 USC §119 to Japanese Patent Application No. 2006-237050 filed Aug. 31, 2006, the contents of which are herein incorporated by reference in their entirety for all purposes.

TECHNICAL FIELD

The present invention relates to power conversion apparatus, such as inverters for converting DC voltage to AC voltage and converters for converting AC voltage to DC voltage.

BACKGROUND ART

As a power conversion apparatus, such as an inverter for converting a DC voltage to an AC voltage and a converter for converting an AC voltage to a DC voltage, there has been known a power conversion apparatus performing power conversion by a plurality of switching devices, as disclosed in Patent Document 1, for example. Patent Document 1 discloses that with the use of devices made of SiC semiconductor as main switching devices, the carrier frequency for PWM control can be increased, and the efficiency can be improved when compared with the conventional ones.

Wide band gap semiconductors, such as the above SiC semiconductor have dielectric breakdown fields approximately 10 times as high as the conventional Si semiconductors to facilitate implementation of increased breakdown voltages of the devices. Accordingly, an apparatus having the same breakdown voltage can be thinner than that using Si semiconductor. Hence, conduction loss can be minimized, and the device can be compacted.

Since the wide band gap semiconductors are operable at high speed and at high temperature (e.g., 300° C.), high speed operation can achieve high efficiency of the apparatuses as a whole, and such devices can operate under a high temperature situation caused by chip size reduction, thereby reducing the size of the apparatus.

Patent Document 1: Japanese Unexamined Patent Application Publication No. 2006-42529

DISCLOSURE OF THE INVENTION

Problems that the Invention is to Solve

The use of the wide band gap semiconductors can realize devices operable at high temperature. While, peripheral components, such as a driver, a CPU, and the like are arranged around the devices. When the temperature of the devices made of wide band gap semiconductor increases caused by its size reduction, the peripheral components, which have relatively low heat resistant temperatures, may be damaged thermally.

Therefore, the devices made of wide band gap semiconductor are also under the same temperature constraint as the peripheral components, and thus are substantially inoperable under high temperature condition.

The present invention has been made in view of the foregoing, and its objective is to obtain a power conversion apparatus in which components having low heat resistant temperatures are prevented from receiving thermal damage by heat generated at a chip made of wide band gap semiconductor.

Means for Solving the Problems

To attain the above object, in a power conversion apparatus in accordance with a first aspect of the present invention, in order to prevent a peripheral component (25) having a low heat resistant temperature from receiving thermal damage by heat of a chip (21) made of wide band gap semiconductor, the peripheral component (25) is thermally insulated from a chip portion (20) having a high heat resistant temperature including the chip (21).

Specifically, the first aspect is directed toward a power conversion apparatus including: a chip portion (20) including a chip (21) made of wide band gap semiconductor and a member (22, 23) having a heat resistant temperature equal to or higher than that of the chip (21); and a peripheral component (25) arranged in the vicinity of the chip portion (20) and having a heat resistant temperature lower than that of the chip (21). The chip (21) and the peripheral component (25) are thermally insulated from each other so that a temperature of the peripheral component (25) does not exceed the heat resistant temperature of the peripheral component (25).

Herein, the term "thermal insulation" and its variants include suppression of heat transfer besides perfect heat interception.

With the above arrangement, the heat of the chip portion (20) composed of the wide band gap semiconductor chip (21) and the member (22, 23) having a heat resistant temperature equal to or higher than that of the chip (21) is prevented from being transferred to the peripheral component (25) having a lower heat resistant temperature than that of the chip (21). This prevents the peripheral component (25) from being at high temperature by the heat of the chip (21), and thus, receives no thermal damage.

Hence, the chip (21) made of wide band gap semiconductor becomes operable under a high temperature condition, thereby achieving miniaturization and high-speed operation of the chip (21).

In the above arrangement, the chip portion (20) further includes: heat dissipation means (23) for dissipating heat of the chip (21); and a heat transfer member (22) for transferring the heat of the chip (21) to the heat dissipation means (23), and at least one of the heat transfer member (22) and the heat dissipation means (23) is supported by the peripheral component (25) with a heat insulating member (24) as means for the heat insulation intervening therebetween (a second aspect of the present invention).

With the above arrangement, the heat dissipation means (23) dissipates the heat generated at the chip (21) via the heat transfer member (22) to lower the temperature of the chip (21) efficiently. Further, at least one of the heat transfer member (22) and the heat dissipation means (23) is supported by the peripheral member (25) with heat transfer from the heat transfer member (22) suppressed by the heat insulating member (24), and accordingly, the at least one of the heat transfer member (22) and the heat dissipation means (23) can be supported firmly, while the peripheral component (25) can be prevented from being at high temperature by the heat of the chip (21). Namely, an additional member for supporting the at least one of the heat transfer member (22) and the heat dissipation means (23) can be omitted, while the peripheral component (25) can be prevented from receiving thermal damage. Hence reduction in size and cost of the apparatus as a whole can be achieved.

Herein, it is preferable that the heat insulating member (24) is a heat resistant adhesive for bonding at least one of the heat transfer member (22) and the heat dissipation means (23) to the peripheral component (25) (a third aspect of the present invention). With the use of the heat insulating adhesive, the peripheral component (25) can be prevented from being at high temperature by the heat of the chip (21) through the heat transfer member (22), and the at least one of the heat transfer member (22) and the heat dissipation means (23) can be bonded and fixed to the peripheral component (25) to be supported. Examples of the heat resistant adhesive include polyimide-base adhesives, ceramic-base adhesives, and the like.

Preferably, the means (26) for heat insulation is a heat insulating plate (26) provided for suppressing heat radiation from the chip portion (20) toward the peripheral component (25) (a fourth aspect of the present invention). The heat insulating plate (26) can intercept heat radiation from the chip (20) to ensure suppression of temperature rise of the peripheral component (25).

The chip portion (20) and the peripheral component (25) are connected to each other electrically by means of a bonding wire (27) (a fifth aspect of the present invention). This configuration can suppress the heat transfer when compared with the use of a member such as a pattern electrically connecting the chip (20) and the peripheral component (25), thereby ensuring suppression of temperature rise of the peripheral component (25).

In a sixth aspect of the present invention, a package (41) in which a chip made of wide band gap semiconductor is thermally insulated from a printed circuit board (42) on which the package (41) is mounted and a component on the board (43) not to allow the printed circuit board (43) and the component on the board (43) to be at a temperature over the heat resistant temperature.

Specifically, the sixth aspect is directed toward a power conversion apparatus including: a package (41) in which a chip made of wide band gap semiconductor is sealed; and a printed circuit board (43) on which a pattern (44) connected to a terminal (42) of the package (41) is formed. The package (41) is thermally insulated from the printed circuit board (43) and a component on the printed circuit board (43) so that temperatures of the printed circuit board (43) and the component thereon are equal to or lower than respective heat resistant temperatures thereof even when a temperature of the chip exceeds the heat resistant temperature of at least one of the printed circuit board (43) and the component on the printed circuit board (43).

With the above arrangement, heat transfer from the package (41) in which the chip made of wideband gap semiconductor is sealed to the printed circuit board (43) and the component on the board (43) can be suppressed to ensure prevention of the printed circuit board (43) and the component on the board (43) from being at a temperature over their heat resistant temperatures. It is noted that the maximum temperature at which the Si semiconductor material is operable is approximately 150° C., and the heat resistant temperature where the printed circuit board (43) is made of resin is approximately 130° C.

In the above configuration including the package (41) in which the chip is sealed, preferably, at least one of the terminal (42) and the pattern (44) has a heat dissipation area configured not to allow the temperature of the printed circuit board (43) to exceed the heat resistant temperature of the printed circuit board (43), and means (42, 44) for heat insulation is the at least one of them which has the heat dissipation area (a seventh aspect of the present invention).

Accordingly, the heat generated at the chip in the package (44) may be dissipated from at least one of the terminal (42) and the pattern (44) which has a sufficiently large heat dissipation area. Hence, the printed circuit board (43) can be securely prevented from increasing in temperature up to a high temperature over the heat resistant temperature of the board (43).

As specific strategies for increasing the heat dissipation area, in the terminal (42), the length or the width thereof may be increased, or projections and depressions may be formed on the surface thereof. Alternatively, the width of the pattern (44) may be increased to increase the surface area.

Preferably, the means (46) for heat insulation may be air blowing means (46) for blowing air toward at least one of the terminal (42) and the pattern (44) (an eighth aspect of the present invention). Cooling at least one of the terminal (42) and the pattern (44) by air blowing means (46) ensures prevention of the printed circuit board (43) from being at high temperature by the heat of the chip.

In the above configuration, the means (47) for heat insulation may be a heat insulating plate (47) provided for suppressing heat radiation from the package (41) toward the printed circuit board (43) (a ninth aspect of the present invention). Hence, temperature rise of the printed circuit board (43) by the heat radiation from the package (41) can be prevented securely.

In a tenth aspect of the present invention, a package (41) including a chip made of wide band gap semiconductor is mounted on a high heat resistant printed circuit board (51), and a low heat resistant printed circuit board (53) is separated thermally from the high heat resistant printed circuit board (51) for suppressing temperature rise of the low heat resistant printed circuit board (53) by the heat of the chip.

Specifically, the tenth aspect is directed to a power conversion apparatus, comprising: a package (41) including a chip made of wide band gap semiconductor; a high heat resistant printed circuit board (51) having a high heat resistant temperature durable at a maximum temperature of the package (41); and a low heat resistant printed circuit board (53) having a lower heat resistant temperature than the maximum temperature. The package (41) is mounted on the high heat resistant printed circuit board (51) so that the low heat resistant printed circuit board (53) is thermally insulated from the package (41).

With the above arrangement, even if the wide band gap semiconductor chip is at high temperature, the printed circuit board (51) on which the package (41) including the chip is mounted can be prevented from receiving thermal damage because the printed circuit board (51) has high heat resistance. The package (41) is mounted on the high heat resistant printed circuit board (51), which inhibits the heat transfer to the low heat resistant printed circuit board (53). Hence, the low heat resistant printed circuit board (53) can be prevented from being at high temperature.

The above arrangement preferably includes: a heat insulating plate (54, 55) configured to suppress heat radiation from the package (41) toward the low heat resistant printed circuit board (53) (an eleventh aspect of the present invention). This can ensure prevention of the low heat resistant printed circuit board (53) from being at high temperature by heat radiation from the package (41).

In the any of the above arrangements, the printed circuit board (61) on which a component made of wide band gap semiconductor is mounted is divided into a high temperature section (63) and a low temperature section (62) according to operation temperatures of devices (66, 67) mounted thereon, and a pattern (64, 64') electrically connecting the high temperature section (63) to the low temperature section (62) on the printed circuit board (61) is provided with heat transfer suppressing means (64a, 65) (a twelfth aspect of the present invention).

With the above arrangement, in the case where the device (67) operable at high temperature and the device (66) operable at low temperature are mounted on the printed circuit board (61), and are electrically connected to the pattern (64), provision of the heat transfer suppressing means (64a, 65) at the pattern (64) can prevent heat transfer from the high temperature section (63), that is, the device (67) operable at high temperature, to the low temperature section (62), that is, the device (66) operable at low temperature, to thus prevent the device (66) in the low temperature section (62) from being at high temperature.

In the above arrangement, it is preferable that the heat transfer suppressing means (64a) is a part (64a) of the pattern (64) which has relatively high heat resistance. (a thirteenth aspect of the present invention). When the relatively high heat resistant part (64a) is provided at the pattern (64) to serve as heat transfer suppressing means, heat transfer from the high temperature section (63) to the low temperature section (62) can be suppressed to thus prevent the low temperature section (62) from being at high temperature.

The heat transfer suppressing means (65) may be a resistor (65) provided at the pattern (64') for inhibiting heat transfer from the high temperature section (63) to the low temperature section (62) (a fourteenth aspect of the present invention). Provision of the resistor (65) can inhibit the heat transfer from the high temperature section (63) to the low temperature section (62) as well, thereby preventing the low temperature section (62) from being at high temperature.

Referring to a fifteenth aspect of the present invention, in the case where a driver section (72) for driving a device (71) made of the wide band gap semiconductor is also made of wide band gap semiconductor, the device (71) and the driver section (72) are arranged in the same package (70), and the package (70) is thermally insulated from a peripheral component (73, 74) to thus prevent the peripheral component (73, 74) from being at high temperature.

Specifically, the fifteenth aspect is directed toward a power conversion apparatus, including: a device (71) of wide band gap semiconductor; and a driver section (72) for driving the device (71). The driver section (72) is made of wide band gap semiconductor and is arranged in a single package (70) together with the device (71), and the package (70) is thermally insulated from a peripheral component (73, 74) in the vicinity thereof.

In the above arrangement, not only the device (71) made of wide band gap semiconductor but also the driver section (71) for driving the device (71) is made of wide band gap semiconductor, and they are arranged in the same package (70). Further, the peripheral component (73, 74) is thermally insulated from the package (70). This arrangement can protect the peripheral component (73, 74) from the heat of the package (70) securely, and can eliminate the need of thermal protection of the driver section (72) which is usually arranged near the device (71).

Herein, the wide band gap semiconductor may be SiC semiconductor (a sixteenth aspect of the present invention). With the use of SiC semiconductor, a semiconductor chip (13) can be obtained which exhibits low loss and high heat resistance.

ADVANTAGES OF THE INVENTION

In the power conversion apparatus in accordance with the present invention, the chip portion (20) operable at high temperature including the chip (21) made of wide band gap semiconductor is thermally insulated from the peripheral component (25) having a lower heat resistant temperature than that of the chip portion (20). This can prevent the peripheral component (25) from being at high temperature by the heat of the chip (21) to prevent the peripheral component (25) from receiving thermal damage. Hence, the chip (21) made of the wide band gap semiconductor can be operated under a high temperature condition to achieve downsizing and high-speed operation of the chip (21).

In the second aspect of the present invention, the chip portion (20) includes the heat dissipation means (23) for dissipating the heat of the chip (21) and the heat transfer member (22) for transferring the heat of the chip (21) to the heat dissipation means (23), and at least one of the heat transfer member (22) and the heat dissipation means (23) is supported by the peripheral component (25) through the heat insulating member (24). Hence, the peripheral component (25) can be prevented securely from being at high temperature by the heat of the chip (21), while the supporting structure for at least one of the heat transfer means (22) and the heat dissipation means (23) can be simplified, thereby achieving downsizing and cost reduction of the apparatus as a whole.

In the third aspect of the present invention, the heat insulating member (24) is a heat resistant adhesive. The heat resistant adhesive can support at least one of the heat transfer member (22) and the heat dissipation means (23) to the peripheral component (25) securely. The heat conduction from the heat transfer member (22) to the peripheral component (25) can be suppressed by the resistance adhesive, thereby ensuring prevention of the peripheral component (25) from being at high temperature.

According to the fourth aspect of the present invention, the heat radiation from the chip portion (20) toward the peripheral component (25) may be suppressed by the heat insulating plate (26), thereby ensuring prevention of the peripheral component (25) from being at high temperature by the heat of the chip portion (20).

In the fifth aspect of the present invention, the chip portion (22) and the peripheral component (25) are electrically connected to each other by means of the bonding wire (27). Hence, the peripheral component (25) can be further securely prevented from being at high temperature by the heat of the chip portion (20) via the member electrically connecting the chip portion (20) to the peripheral component (25).

In the power conversion apparatus in accordance with the sixth aspect of the present invention, the heat transfer from the package (41), in which the wide band gap semiconductor chip is sealed, to the printed circuit board (43), on which the package (41) is mounted, and the component on the board (43) is suppressed so that the respective temperatures of the printed circuit board (43) and the component on the board (43) are not exceeding their heat resistant temperatures. Hence, the printed circuit board (43) and the component on the board (43) can be prevented from being at high temperature to thus receive no thermal damage.

In the seventh aspect of the present invention, at least one of the terminal (42) of the package (41) and the pattern (44) on the printed circuit board (43) has a heat dissipation area allowing the printed circuit board (43) to be at a temperature not exceeding its heat resistant temperature. Accordingly, the heat of the chip in the package (41) can be dissipated from at least one of the terminal (42) and the pattern (44) to allow the printed circuit board (43) to be at a temperature not exceeding its heat resistant temperature, thereby preventing thermal damage of the board (43).

In the eighth aspect of the present invention, the air blowing means (46) is provided for cooling at least one of the terminal (42) and the pattern (44). This enables efficient dissipation of the heat of the chip from at least one of the terminal (42) and the pattern (44), thereby further ensuring prevention of the printed circuit board (43) from being at high temperature.

In the ninth aspect of the present invention, the heat insulating plate (47) is provided for suppressing the heat radiation from the package (41) toward the printed circuit board (43), thereby further ensuring prevention of the printed circuit board (43) from being at high temperature.

In the power conversion apparatus in accordance with the tenth aspect of the present invention, the package (41) including the wide band gap semiconductor chip is mounted on the high heat resistant printed circuit board (51) for suppressing the heat transfer from the package (41) to the low heat resistant printed circuit board (53). Hence, the low heat resistant printed circuit board (53) can be prevented from being at high temperature to thus receive no thermal damage.

In the eleventh aspect of the present invention, the heat insulating plate (54, 55) is provided for suppressing the heat radiation from the package (41) toward the low heat resistant printed circuit board (53). This can further ensure prevention of the low heat resistant printed circuit board (53) from being at high temperature.

In the twelfth aspect of the present invention, in the printed circuit board (61) on which the devices (66, 67) of the wide band gap semiconductor are mounted, the heat transfer suppressing means (64a, 65) is provided at the pattern (64) connecting the high temperature section (63) including the device (66) operable at high temperature with the low temperature section (62) including the device (67) operable at low temperature. This can prevent the low temperature section (62) from being at high temperature by the heat of the high temperature section (63) via the pattern (64) to thus receive no thermal damage.

In the thirteenth aspect of the present invention, the part (64a) having relatively high heat resistance is provided at the pattern (64), so that the transfer of the heat of the high temperature section (63) can be inhibited by the part (64a) of the pattern (64) which has high heat resistance, thereby ensuring prevention of the low temperature section (62) from being at high temperature.

In the fourteenth aspect of the present invention, the resistor (65) is provide at the pattern (64) for inhibiting heat conductance from the high temperature section (63) to the low temperature section (62), with a result that the low temperature section (62) can be prevented further securely from being at high temperature by the heat of the high temperature section (63) via the pattern (64).

In the power conversion apparatus in accordance with the fifteenth aspect of the present invention, the device (71) and the driver section (72) for driving the device (71) are made of wide band gap semiconductor, and are mounted in the same package (70). Further, the package (70) is insulated from the peripheral component (73, 74). Hence, the heat of the component made of wide band gap semiconductor operable at high temperature can be prevented from being transferred to the peripheral component (73, 74) of which the heat resistant temperature is lower than that of the component (70) to prevent the peripheral component (73, 74) from receiving thermal damage. In addition, thermal protection for the driver section (72) arranged near the device (71) can be omitted.

In the sixteenth aspect of the present invention, the wide band gap semiconductor is SiC semiconductor, which enables attainment of a main switching device (13) small in size and operable at high temperature.

BRIEF DESCRIPTION OF THE DRAWINGS

FIG. 9 presents views schematically showing states of heat insulation, in which FIG. 9(a) shows the case where only device is made of SiC, and FIG. 9(b) shows the case where the device and a driver are made of SiC and are packaged.

Figure 1:
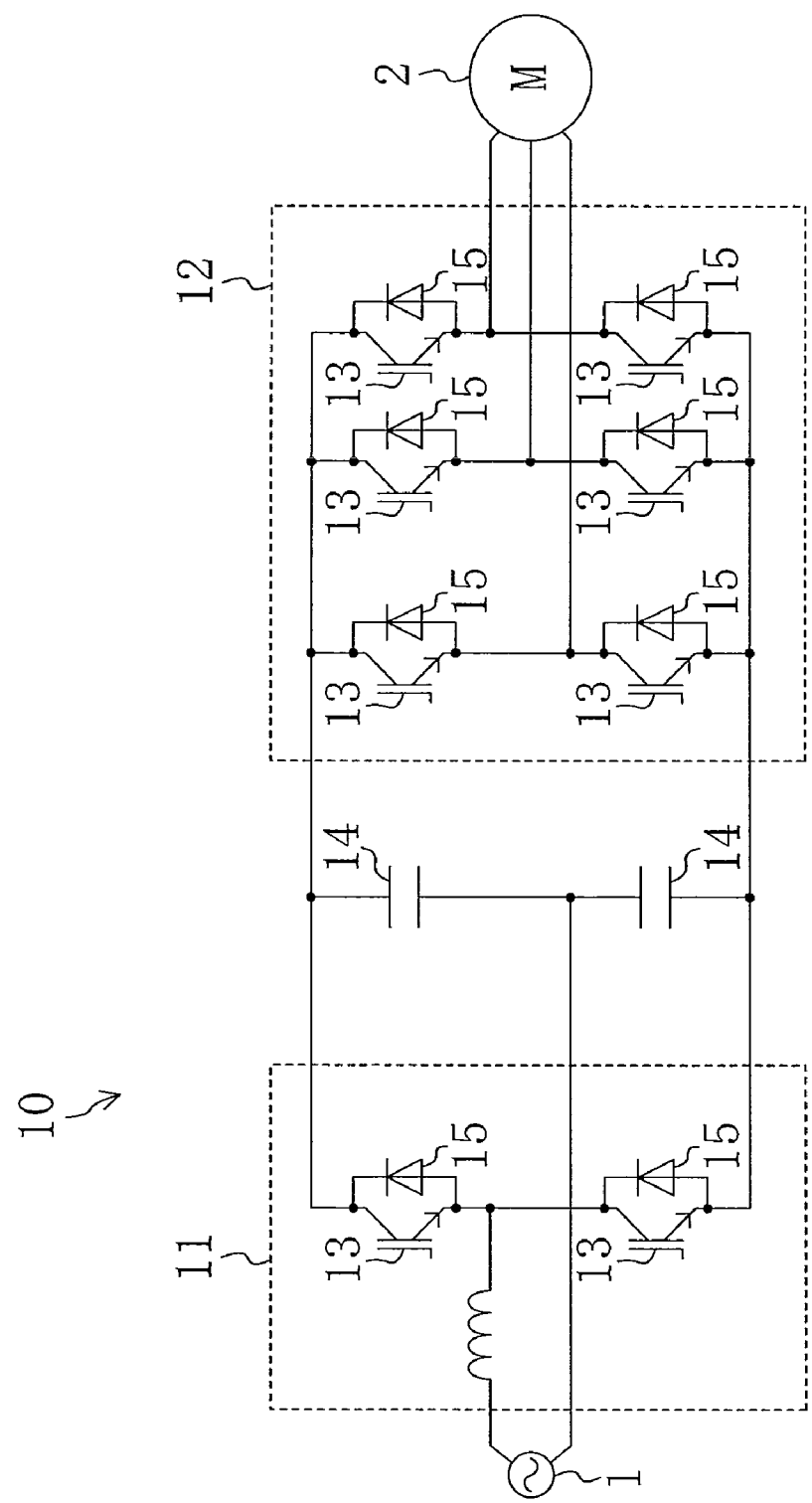
FIG. 1 is a circuit diagram showing one example of a main circuit of a power conversion apparatus in accordance with Embodiment 1 of the present invention.

INDEX OF REFERENCE NUMERALS 10 power conversion apparatus
20 chip portion
21 chip
22 copper substrate (heat transfer member)
23, 45 heat sink (heat dissipation means)
24 heat insulating member
25, 61 printed circuit board
26, 47, 54, 55 heat insulating plate
27 bonding wire
41, 70 package
42, 52 terminal
43 printed circuit board
44, 64 pattern
46 fan
51 high heat resistant printed circuit board
53 low heat resistant printed circuit board
62 low temperature section
63 high temperature section
64a part having high heat resistance resistor
66, 67, 71 device
72 driver section
73 CPU (peripheral component)
74 peripheral circuit (peripheral component)
75 heat insulation

BEST MODE FOR CARRYING OUT THE INVENTION

Embodiments of the present invention will be described below in detail with reference to the accompanying drawings. It is noted that the following preferred embodiments are mere essential examples, and are not intended to limit the scope, applicable subjects, and use of the present invention.

Embodiment 1

—Overall Configuration—

FIG. 1 shows one example of a circuit of a power conversion apparatus (10) in accordance with Embodiment 1 of the present invention. The power conversion apparatus (10) includes a converter section (11) converting an AC voltage to a DC voltage, and an inverter section (12) converting the DC voltage converted in the converter section (11) to a three-phase AC voltage. The converter section (11) and the inverter section (12) are connected to an AC power source (1) and a motor (2) as a load, respectively.

Each of the converter section (11) and the inverter section (12) includes a plurality of main switching devices (13, 13, . . . ). According to switching operations of the main switching devices (13, 13, . . . ), the converter section (11) performs rectification from the AC voltage to the DC voltage, while the inverter section (12) performs power conversion from the DC voltage to the three-phase AC voltage.

In the power conversion apparatus (10), two condensers (14, 14) for smoothing the output voltage of the converter section (11), which are connected in series to each other, are connected in parallel to the converter section (11) and the inverter section (12).

The converter section (11) includes a half bridge circuit by the main switching devices (13, 13), and one end of the AC power source (1) is connected between the two condensers (14, 14) connected in series. Whereby, the converter section (11) and the condensers (14, 14) form a voltage doubling circuit. The voltage doubling circuit in the present embodiment is, but is not limited to, of half bridge type, and may be of full bridge type or a synchronous rectifying circuit performing synchronous rectification.

The main switching devices (13) are made of wide band gap semiconductor having low conduction loss and operable at high speed and at high temperature, such as SiC or the like. The main switching devices (13) may be, for example, IGBTs shown in FIG. 1, MOSFETs of unipolar transistors, or any other devices as long as they can perform switching operation. In each of the switching devices (13), a diode (15) is provided in inverse-parallel connection.

The power conversion apparatus (10) is not limited to the above configuration, and may be a converter performing only rectification from an AC voltage to a DC voltage or an inverter performing only power conversion from a DC voltage to an AC voltage, for example.

—Chip Mounting Structure—

Next, a chip mounting structure will be described where a chip is made of wide band gap semiconductor, such as SiC or the like in the power conversion apparatus (10) configured as above. Herein, the case where the main switching devices (13) are made of wide band gap semiconductor, such as SiC or the like is mentioned, but does not limit the present invention. Any other devices may be made of wide band gap semiconductor.

Figure 2:
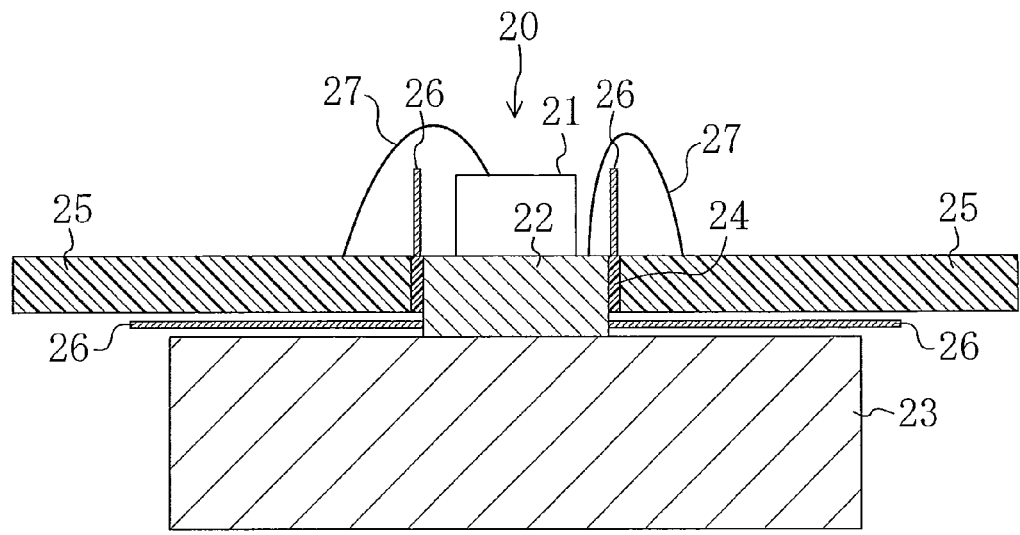
FIG. 2 is a sectional view schematically showing a chip mounting structure.

A chip (21) made of wide band gap semiconductor, such as SiC or the like is operable under a high temperature environment, and may therefore be at high temperature. In view of this, as shown in FIG. 2, the chip (21) is connected to a heat sink (23) as heat dissipation means via a copper substrate (22) as a heat transfer member so that the heat of the chip (21) is dissipated from the heat sink (23). In other words, the chip (21) is arranged on the surface of a stacked body in which the heat sink (23) and the copper substrate (22) are stacked in this order. The stacked body and the chip (21) form a chip portion (20) in the present invention.

Resin-made printed circuit boards (25, 25), for example, are arranged on the respective sides of the copper substrate (22) with heat insulating members (24) intervening therebetween. Specifically, each heat insulating member (24) is a heat resistant adhesive of polyimide base or ceramic base, and bonds and fixes the associated printed circuit board (25, 25) to the copper substrate (22) so that the upper surfaces of all of them are flush with one another. Each printed circuit board (25) corresponds to a peripheral component in the first aspect of the present invention.

With the above configuration, the printed circuit boards (25, 25) can support the copper substrate (22) and the heat sink (23) without necessitating an additional support member therefor. This reduction in the number of parts can lead to reduction in size and cost of the apparatus as a whole. The printed circuit boards (25, 25) are bonded and fixed to the copper substrate (22) by means of the heat resistant adhesive as the heat insulating member (24), and accordingly, the printed circuit boards (25, 25) can be prevented from being at high temperature by the heat of the chip (21) via the copper substrate (22). Either the copper substrate (22) or the heat sink (23) may be supported by another supporting member rather than by the printed circuit boards (25, 25).

Between the chip portion (20) and the printed circuit boards (25, 25), heat insulating plates (26, 26) are provided for suppressing temperature rise of the printed circuit boards (25, 25) by heat radiation from the chip portion (20). Specifically, the heat insulating plates (26, 26) are arranged between the copper substrate (22) on which the chip (21) is mounted and the printed circuit boards (25, 25), and between the printed circuit boards (25, 25) and the heat sink (23), for protecting the printed circuit boards (25, 25) from the heat radiation from the chip portion (20). The heat insulating plate (26, 26) are preferably, but not limited to be, formed with a member having heat resistance, such as ceramic or the like, and can be made of any material as long as it can reduce heat radiated from the chip.

Provision of the heat insulating plates (26, 26) can ensure prevention of the printed circuit boards (25, 25) from being at high temperature by influence of the heat of the chip (21), thereby ensuring prevention of the printed circuit boards (25, 25) from receiving thermal damage.

In the above configuration, wire bonding using bonding wires (27, 27) is employed for electrically connecting the chip (21) and the copper substrate (22) to patterns (not shown) on the printed circuit boards (25). Connection by the bonding wires (27, 27) can prevent heat conduction from the chip portion (20) to the printed circuit boards (25, 25), when compared with the case of connection through patterns or the like. Accordingly, temperature rise of the printed circuit boards (25, 25) can be suppressed. Hence, the printed circuit boards (25, 25) can be prevented further securely from being at high temperature to thus receive no thermal damage.

Advantages of Embodiment 1

In Embodiment 1, the chip (21) made of wide band gap semiconductor, such as SiC or the like is mounted on the stacked body of the copper substrate (22) and the heat sink (23) to form the chip portion (20), and each printed circuit board (25, 25) is fixed to the copper substrate (22) by means of the heat resistant adhesive (24, 24). Accordingly, the heat of the chip (21) can be dissipated efficiently from the heat sink (23) via the copper substrate (22), and the printed circuit boards (25, 25) can be supported by the copper substrate (22) with no additional support member necessitated. This reduction in the number of parts can lead to reduction in size and cost of the apparatus as a whole.

The heat resistant adhesive (24) as the heat insulating member bonds the printed circuit boards (25, 25) and the copper substrate (22), and accordingly, the printed circuit boards (25, 25) can be prevented further securely from being at high temperature by conduction of the heat of the copper substrate (22) to the printed circuit boards (25, 25).

The heat insulating plates (26, 26) are provided between the chip portion (20) and the printed circuit boards (25, 25), thereby further securing prevention of the printed circuit boards (25, 25) from being at high temperature by the heat radiation from the chip portion (20).

Modified Example of Embodiment 1

Figure 3:
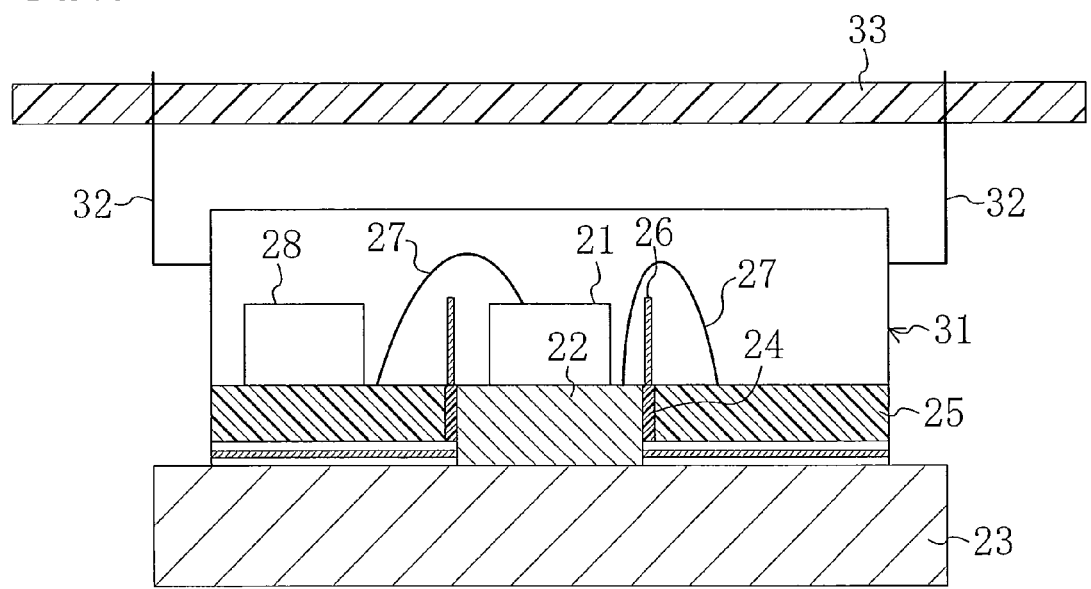
FIG. 3 is a view corresponding to FIG. 2 in accordance with a modified example of Embodiment 1.

The present modified example presents, as shown in FIG. 3, a configuration example where the chip mounting structure shown in FIG. 2 is packaged and is connected to another substrate (33) by means of terminals (32) in addition to Embodiment 1. Other than the package, the modified example is almost the same as Embodiment 1. Therefore, the same reference numerals are assigned to the same parts for describing only different points.

FIG. 3 shows a configuration in which a chip is mounted in a power conversion apparatus in accordance with the present modified example. In the present modified example, as described above, a package (31) accommodates the chip (21), the copper substrate (22), the printed circuit boards (25, 25), the heat insulating plates (26, 26), and the bonding wires (27, 27) in Embodiment 1. In addition, the heat sink (23) is arranged below the package (31), that is, below the copper substrate (22).

A plurality of terminals (32, 32, . . . ) are arranged at the package (31) to be connected to another substrate (33). In FIG. 3, reference numeral 28 denotes a chip made of a material (e.g., Si semiconductor) incapable of operating at high temperature unlike wide band gap semiconductors.

With the above configuration, even in the case of packaging including the chip (21) made of wide band gap semiconductor, such as SiC or the like, another chip (28) can be prevented from being at high temperature in the package (31), and the other substrate (33) can be prevented securely from being at high temperature by transfer of the heat of the chip (21) made of wide band semiconductor to the substrate (33).

Embodiment 2

Unlike internal heat insulation in Embodiment 1, heat conduction to an external substrate (43) is suppressed in a package (41) in which the chip (21) is sealed in Embodiment 2.

Figure 4:
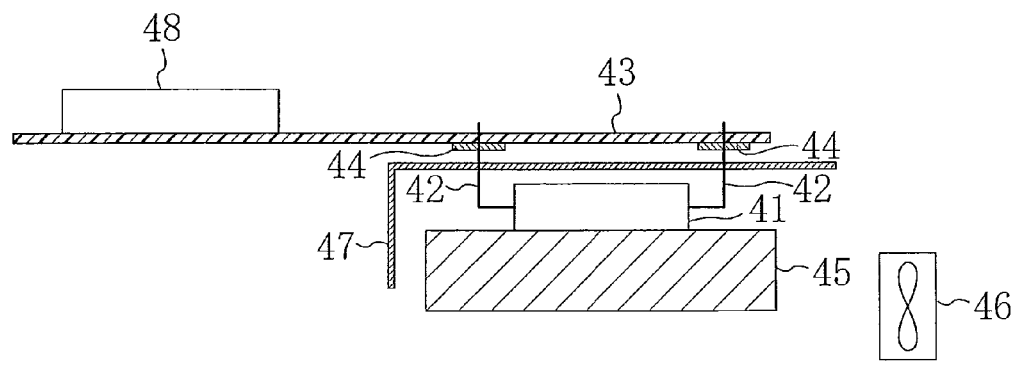
FIG. 4 is a sectional view schematically showing a substrate stacking structure of a power conversion apparatus in accordance with Embodiment 2.

Specifically, as shown in FIG. 4, the package (41) in which a chip made of wide band gap semiconductor, such as a SiC or the like is sealed is connected to a resin-made printed circuit board (43) by means of a plurality of terminals (42, 42, . . . ). More specifically, a pattern (44) is formed on the surface (the lower surface in FIG. 3) of the printed circuit board (43), and the terminals (42, 42, . . . ) are electrically connected to the pattern (44).

Referring to the package (41), a heat sink (45) is provided on the opposite side thereof to the printed circuit board (43) so as to dissipate the heat of the package (41) in which the chip is sealed.

The terminals (42, 42, . . . ) of the package (41) are in a shape capable of efficiently dissipating the heat transferred from the package (41) via the terminals (42, 42, . . . ) so that the temperature of the printed circuit board (43) will not exceed its heat resistant temperature and so that the temperatures of components, such as a peripheral circuit (48) and the like on the printed circuit board (43) will not exceed their heat resistant temperatures.

Specifically, the terminals (42, 42, . . . ) is long in length or wide in width, or has projections or ribs on the surface thereof so as to have a large surface area (heat dissipation area).

With the above configuration, the heat of the package (41) can be dissipated from the terminals (42, 42, . . . ) efficiently, with a result that the printed circuit board (43) and the components (48) thereon can be prevented from being at high temperature to thus receive no thermal damage.

The pattern (44) on the printed circuit board (43) is arranged to have a large heat dissipation area so that the temperature of the printed circuit board (43) will not exceed its heat resistant temperature to dissipate the heat of the package (41) efficiently as well.

It may be effective to employ both the thus configured terminals (42, 42, . . . ) and the thus configured pattern (44), but the present invention is not limited thereto, and may employ either one of them.

In order to increase the heat dissipation efficiency of the terminals (42, 42, . . . ) and the pattern (44), a fan (46) as air blowing means may be provided for blowing air toward at least one of the terminals (42, 42, . . . ) and the pattern (44). The fan may be a dedicated fan for cooling the terminals (42, 42, . . . ) or the pattern (44), or a fan for cooling the heat sink (45) in addition.

Similarly to Embodiment 1, a heat insulating plate (47) is provided between the package (41) and the printed circuit board (43) in the present embodiment. The heat insulating plate (47) ensures prevention of the printed circuit board (43) from being at high temperature by the heat radiation from the package (41). Preferably, the heat insulating plate (47) may be, but is not limited to be, formed with a member having heat resistance, such as ceramic, similarly to the case in Embodiment 1, and may be made of any material as long as it can reduce the heat radiated from the package (41).

Advantages of Embodiment 2

In Embodiment 2, a chip made of wide band gap semiconductor, such as SiC or the like is sealed in the package (41). The terminals (42) of the package (41) are connected electrically to the pattern (44) of the printed circuit board (43). The heat dissipation areas of the terminals (42) and the pattern (44) are increased so that the temperatures of the printed circuit board (43) and the components thereon will not exceed their heat resistant temperatures. Thus, the heat of the package (41) can be dissipated from the terminals (42) and the pattern (44). As a result, the printed circuit board (43) is prevented from being at high temperature by the heat of the package (41) to thus receive no thermal damage.

The fan (46) blows air toward the terminals (42) and/or the pattern (44) to increase the heat dissipation efficiency of the terminals (42) and/or the pattern (44), thereby further ensuring prevention of the printed circuit board (43) from being at high temperature.

Provision of the heat insulating plate (47) between the package (41) and the printed circuit board (43) can prevent further securely the printed circuit board (43) from being at high temperature by the heat radiation from the package (41).

Embodiment 3

Rather than direct mounting of the package (41) on the printed circuit board (43) as in Embodiment 2, the package (41) is mounted on a high heat resistant printed circuit board (51) and is then connected to a low heat resistant printed circuit board (53) by means of terminals (52) in Embodiment 3. The same reference numerals are assigned to the same parts as in Embodiment 2 for describing only different points.

Figure 5:
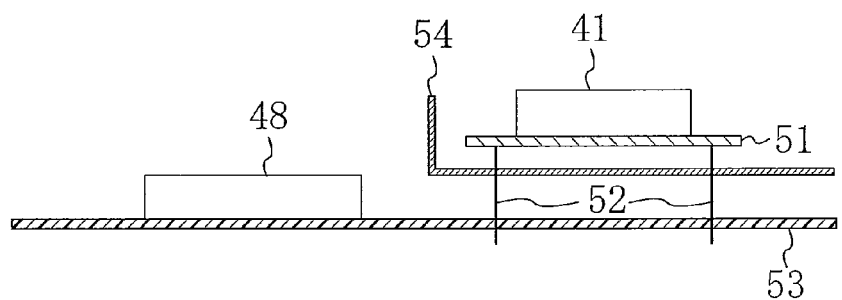
FIG. 5 is a view corresponding to FIG. 4 in accordance with Embodiment 3.

Specifically, as shown in FIG. 5, the package (41) in which a chip of wide band gap semiconductor, such as SiC or the like is sealed is mounted on the high heat resistant printed circuit board (51) of which the resistant temperature is higher than the temperature at which the wide band gap semiconductor is operable. Examples of the high heat resistant printed circuit board (51) include high heat resistant resin or metal substrates, for example.

The high heat resistant printed circuit board (51) on which the package (41) is mounted is connected to the low heat resistant printed circuit board (53) by means of a plurality of terminals (52, 52, . . . ). The low heat resistant printed circuit board (53) may be a general resin-made printed circuit board, for example.

In this way, the package (41) in which the chip of wide band gap semiconductor, such as SiC or the like is sealed is mounted on the high heat resistant printed circuit board (51) to be thermally separated from the low heat resistant printed circuit board (53). Hence, the low heat resistant printed circuit board (53) can be prevented from being at high temperature by direct influence of the heat of the package (41).

Further, as shown in FIG. 5, a heat insulating plate (54) may be provided between the high heat resistant printed circuit board (51) and the low heat resistant printed circuit board (53) for suppressing heat radiation from the package (41) and the high heat resistant printed circuit board (51). This can further ensured prevention of the low heat resistant printed circuit board (53) from being at high temperature to thus receive no thermal damage.

Advantages of Embodiment 3

In Embodiment 3, a chip made of wide band gap semiconductor, such as SiC or the like is sealed in the package (41). The package (41) is mounted on the high heat resistant printed circuit board (51). The high heat resistant printed circuit board (51) is connected to the low heat resistant printed circuit board (53) by means of the terminals (52). Hence, the low heat resistant printed circuit board (53) can be prevented from being at high temperature by the heat of the package (41) to thus receive no thermal damage.

Provision of the heat insulating plate (54) between the high heat resistant printed circuit board (51) and the low heat resistant printed circuit board (53) can prevent further securely the low heat resistant printed circuit board (53) from being at high temperature by the heat radiation from the package (41) and the high heat resistant printed circuit board (51).

Modified Example of Embodiment 3

Unlike Embodiment 3, the low heat resistant printed circuit board (53) and the high heat resistant printed circuit board (51) are merely arranged adjacently to each other in the present modified example. Other than adjacent arrangement of the boards (51, 53), the configuration is almost the same as that in Embodiment 3, and therefore, the same reference numerals are assigned to the same parts as in Embodiment 3 for describing only different points.

Figure 6:
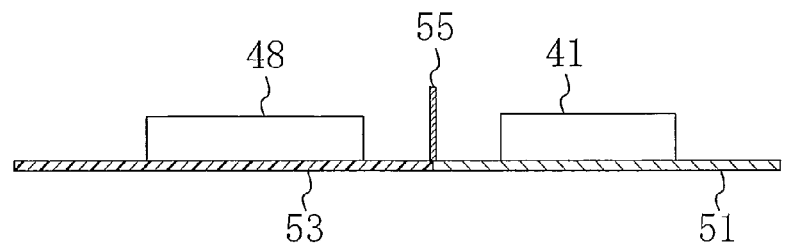
FIG. 6 is a view corresponding to FIG. 4 in accordance with a modified example of Embodiment 3.

Specifically, as shown in FIG. 6, the package (41) in which a chip made of wide band gap semiconductor, such as SiC or the like is sealed is mounted on the high heat resistant printed circuit board (51), and the low heat resistant printed circuit board (53) is arranged beside the high heat resistant printed circuit board (51). The high heat resistant printed circuit board (51) and the low heat resistant printed circuit board (53) are connected electrically to each other by means of, for example, a bonding wire.

Between the high heat resistant printed circuit board (51) and the low heat resistant printed circuit board (53), a heat insulating plate (55) is provided for preventing the low heat resistant printed circuit board (53) from being at high temperature by the heat radiation from the package (41) and the high heat resistant printed circuit board (51). With this configuration, the low heat resistant printed circuit board (53) is securely prevented from receiving thermal damage by the heat radiation from the package (41).

Embodiment 4

Embodiment 4 refers to the case where a low temperature section (62) and a high temperature section (63) are formed according to operation temperatures of devices (66, 67) on a single printed circuit board (61), and are connected to each other by means of a pattern (64). In this case, heat generated at the high temperature section (63) is prevented from being transferred to the low temperature section (62) via the pattern (64) to prevent the low temperature section (62) from being at high temperature.

Figure 7:
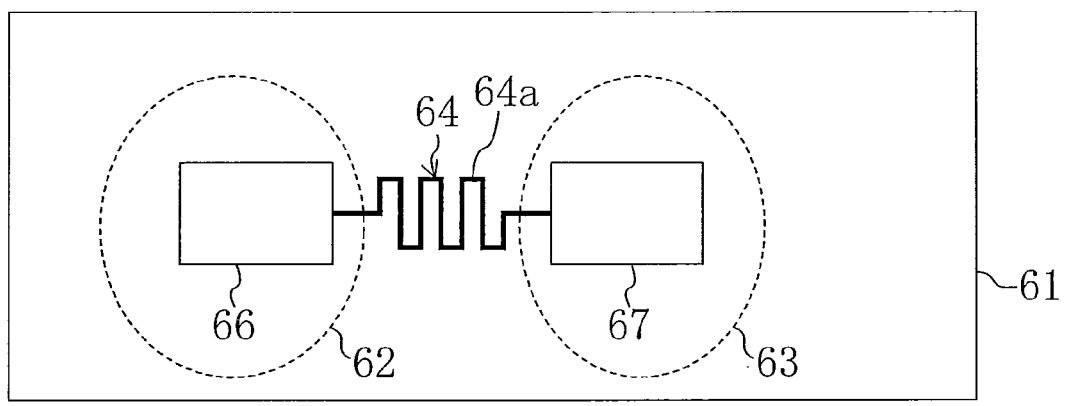
FIG. 7 is a top view schematically showing a substrate structure of a power conversion apparatus in accordance with Embodiment 4.

Specifically, in the case where a plurality of devices (66, 67) are mounted on the printed circuit board (61), as shown in FIG. 7, the printed circuit board (61) is divided into the low temperature section (62) and the high temperature section (63) according to the operation temperatures of the devices (66, 67). In this case, if they are connected electrically to each other by means of the pattern (64) formed on the printed circuit board (61), the heat of the device (67) in the high temperature section (63) may be transferred to the device (66) in the low temperature section (62) via the pattern (64) to increase the temperature of the device (66).

Particularly, in the case where the device (67) in the high temperature section (63) is the package (41) of wide band gap semiconductor, such as SiC or the like operable under a high temperature condition, while the device (66) in the low temperature section (62) is made of Si semiconductor or the like inoperable under a high temperature condition, when the device (67) in the high temperature section (63) becomes at high temperature, the heat thereof may be transferred to the device (66) in the low temperature section (62) via the pattern (64) to cause a state that the temperature of the device (66) in the low temperature section (62) may exceed its heat resistant temperature.

For tackling this problem, the pattern (64) of the printed circuit board (61) is formed to have high heat resistance. Specifically, as shown in FIG. 7, a part (64a) in the middle of the pattern (64) is accordion folded to elongate the length of the pattern (64) between the high temperature section (63) and the low temperature section (62) as far as possible, thereby increasing the heat resistance of the pattern (64).

With the above configuration, the heat transfer from the high temperature section (63) to the low temperature section (62) can be inhibited to suppress temperature rise of the device (66) in the low temperature section (62).

Figure 8:
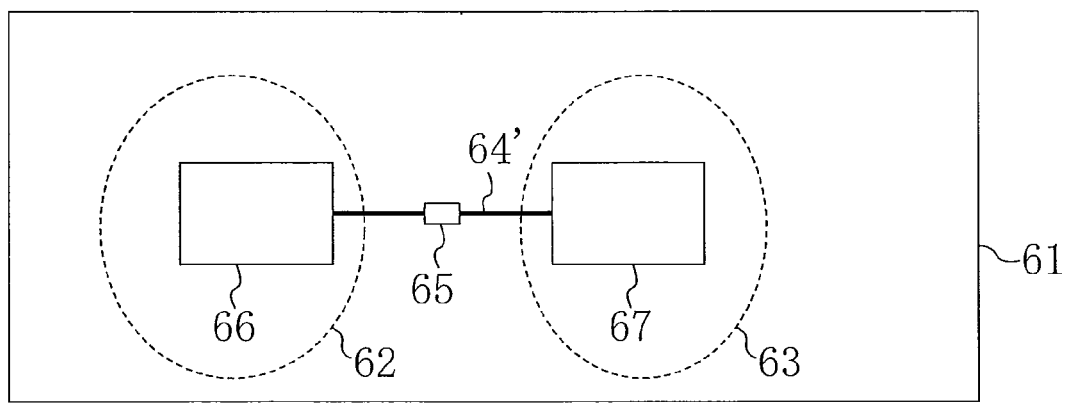
FIG. 8 is a view corresponding to FIG. 7 where a resistor is provided on a pattern in Embodiment 4.

The pattern (64) is not limited to one having high heat resistance, and a resistor (65) may be provided in the middle of a pattern (64'), as shown in FIG. 8. The resistor (65) has higher heat resistance than the pattern (64') so as to inhibit heat transfer from the high temperature section (63) to the low temperature section (62).

Advantages of Embodiment 4

In Embodiment 4, in the case where a plurality of devices (66, 67) different in operable temperature from each other, for example, a device made of wide band gap semiconductor, such as SiC or the like and a device made of Si semiconductor are mounted on the same printed circuit board (61), and the high temperature section (63) of the device (67) operable at relatively high temperature and the low temperature section (62) of the device (66) operable at relatively low temperature are connected to each other by means of the pattern (64), the pattern (64) is elongated in length, or the resistor (65) is provided in the middle thereof. Hence, the heat resistance between the high temperature section (63) and the low temperature section (62) can be increased to enable suppression of temperature rise of the low temperature section (62) by the heat of the high temperature section (63).

Hence, the low temperature section (62) is securely prevented from being at high temperature to thus receive no thermal damage.

Embodiment 5

Unlike Embodiments 1 to 4, in Embodiment 5, not only a device (71), such as a chip but also a driver section (72) for driving the device (71) is made of wide band gap semiconductor, such as SiC or the like, and the device (71) and the driver section (72) each operable at high temperature are thermally insulated from peripheral components (73, 74) having low heat resistant temperatures. The term, heat insulation and its variants herein include suppression of heat transfer besides perfect interception of heat transfer.

Figure 9:
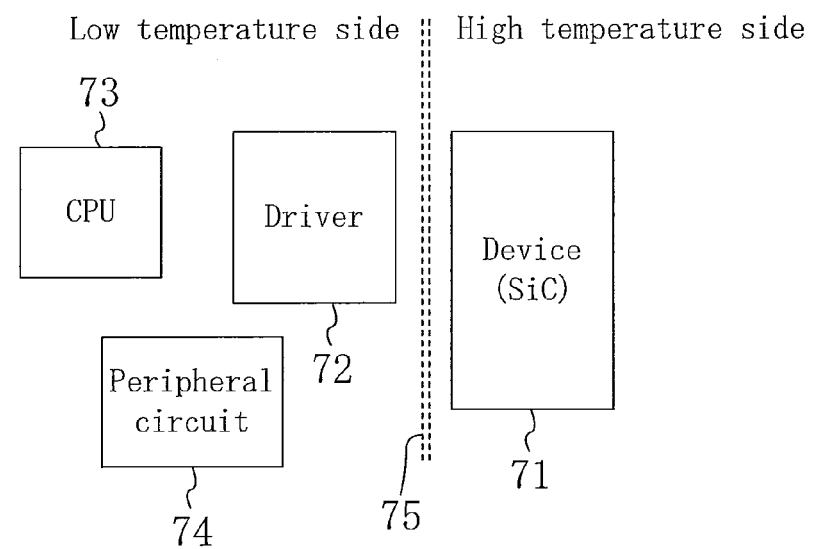
Figure 9:
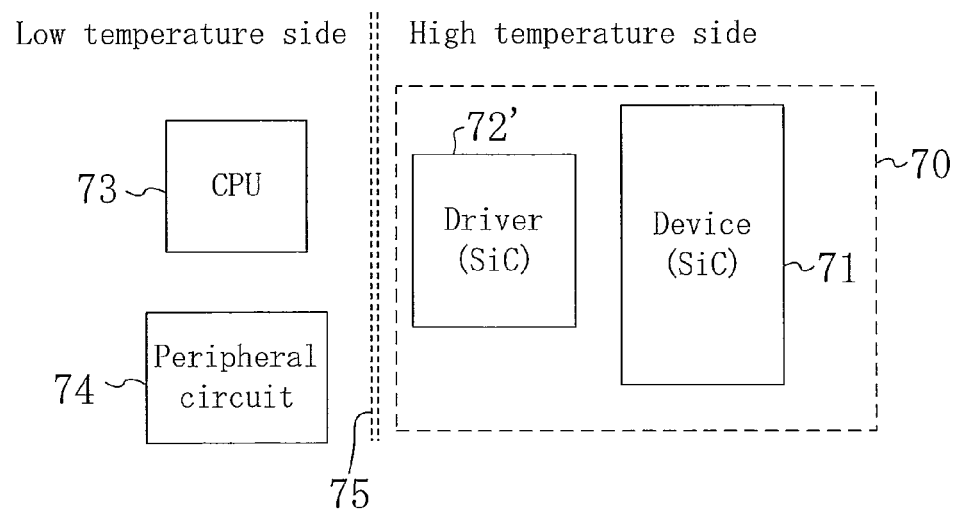

Specifically, rather than in Embodiments 1 to 4 in which only the device (71), such as the chip (21) is made of wide band gap semiconductor and heat transfer between it and the other components is suppressed (FIG. 9(*a*)), a driver section (72') for driving the device (71) is also made of wide band gap semiconductor, and the device (71) and the driver section (72') are accommodated in a single package (70). Because, it is preferable in view of loss and the like to arrange the driver section (72') for driving the device (71) near the device (71) as far as possible.

Further, heat insulation (75) is provided between the package (70) of components operable at high temperature and other components having low heat resistant temperatures (a CPU (73), a peripheral circuit (74), and the like in the example shown in FIG. 9). The heat insulation (75) has a configuration as in any of Embodiments 1 to 4, for example, so as to inhibit heat transfer from the package (70) to the components (73, 74) having low heat resistant temperatures.

Advantages of Embodiment 5

In Embodiment 5, not only the device (71), such as the chip (21) but also the driver section (72') for driving the device (71) is made of wide band gap semiconductor, such as SiC or the like, and the device (71) and the driver section (72') are accommodated in the same package (70) to thermally insulate the components (73, 74) having low heat resistant temperatures from the package (70). Hence, the heat of the components (71, 73') made of wide band gap semiconductor operable at high temperature is prevented from being transferred to the components (73, 74) having low heat resistant temperatures to prevent the components (73, 74) from being at high temperature.

Thus, the components (73, 74) having low heat resistant temperatures are prevented for being at high temperature, thereby receiving no thermal damage.

In addition, since thermal protection for the driver section (72') arranged near the device (71) is unnecessary, thereby enabling omission of heat transfer control means for the driver section (72').

Other Embodiments

The present invention may have the following configuration.

In the above embodiments, SiC is used as wide band gap semiconductor, but the present invention is not limited thereto. Any semiconductor material having larger wide band gap than that of Si may be used, such as GaN.

INDUSTRIAL APPLICABILITY

As described above, the power conversion apparatus in accordance with the present invention is especially useful where it includes a device such as a chip made of wide band gap semiconductor.

The invention claimed is:

1. A power conversion apparatus, comprising:
   a chip portion including a chip made of wide band gap semiconductor and a member having a heat resistant temperature equal to or higher than that of the chip; and
   a peripheral component arranged in the vicinity of the chip portion and having a heat resistant temperature lower than that of the chip,
   wherein the chip portion further includes:
   a heat dissipater for dissipating heat of the chip; and
   a heat transfer member for transferring the heat of the chip to the heat dissipater, and
   at least one of the heat transfer member and the heat dissipater is supported by the peripheral component with a heat insulating member thermally insulating the chip portion and the peripheral component from each other so that a temperature of the peripheral component does not exceed the heat resistant temperature of the peripheral component.

2. The power conversion apparatus of claim 1, wherein the heat insulating member is a heat resistant adhesive for bonding at least one of the heat transfer member and the heat dissipater to the peripheral component.

3. A power conversion apparatus, comprising:
   a chip portion including a chip made of wide band gap semiconductor and a member having a heat resistant temperature equal to or higher than that of the chip; and
   a peripheral component arranged in the vicinity of the chip portion and having a heat resistant temperature lower than that of the chip,
   wherein a heat insulating plate is provided for suppressing heat radiation from the chip portion toward the peripheral component so that a temperature of the peripheral component does not exceed the heat resistant temperature of the peripheral component.

4. The power conversion apparatus of claim 3, wherein the heat insulating plate is disposed between the chip and the peripheral component.

5. A power conversion apparatus, comprising:
   a chip portion including a chip made of wide band gap semiconductor and a member having a heat resistant temperature equal to or higher than that of the chip; and
   a peripheral component arranged in the vicinity of the chip portion and having a heat resistant temperature lower than that of the chip,
   wherein the chip portion and the peripheral component are thermally insulated from each other so that a temperature of the peripheral component does not exceed the heat resistant temperature of the peripheral component, and
   the chip portion and the peripheral component are directly connected to each other electrically by a bonding wire.

6. A power conversion apparatus, comprising:
a package in which a chip made of wide band gap semiconductor is sealed; and
a printed circuit board on which a pattern connected to a terminal of the package is formed,
wherein at least one of the terminal and the pattern has projections or ribs thermally insulating the package from the printed circuit board and a component on the printed circuit board so that a temperature of the printed circuit board is equal to or lower than a heat resistant temperature of the printed circuit board even when a temperature of the chip exceeds the heat resistant temperature of at least one of the printed circuit board and the component on the printed circuit board.

7. The power conversion apparatus of claim 6, further comprising:
an air blower for blowing air toward at least one of the terminal and the pattern to provide thermal insulation for the package.

8. A power conversion apparatus, comprising:
a package in which a chip made of wide band gap semiconductor is sealed; and
a printed circuit board on which a pattern connected to a terminal of the package is formed,
wherein a heat insulating plate is provided for suppressing heat radiation from the package toward the printed circuit board so that temperatures of the printed circuit board and the component thereon are equal to or lower than respective heat resistant temperatures thereof even when a temperature of the chip exceeds the heat resistant temperature of at least one of the printed circuit board and the component on the printed circuit board.

9. The power conversion apparatus of claim 8, wherein the heat insulating plate is disposed between the package and the printed circuit board.

10. A power conversion apparatus, comprising:
a package including a chip made of wide band gap semiconductor;
a high heat resistant printed circuit board having a high heat resistant temperature durable at a maximum temperature of the package; and
a low heat resistant printed circuit board having a lower heat resistant temperature than the maximum temperature, wherein
the package is mounted on the high heat resistant printed circuit board so that the low heat resistant printed circuit board is thermally insulated from the package, and
the high heat resistant printed circuit board is provided in parallel to the low heat resistant printed circuit board or provided so as to be overlapped with the low heat resistant printed circuit board.

11. The power conversion apparatus of claim 10, further comprising:
a heat insulating plate configured to suppress heat radiation from the package toward the low heat resistant printed circuit board.

12. The power conversion apparatus of claim 10, wherein
the printed circuit board on which a component made of wide band gap semiconductor is mounted is divided into a high temperature section and a low temperature section according to operation temperatures of devices mounted thereon, and
a pattern electrically connecting the high temperature section to the low temperature section on the printed circuit board is provided with a heat transfer suppressor.

13. The power conversion apparatus of claim 12, wherein the heat transfer suppressor is a part of the pattern which has relatively high heat resistance.

14. The power conversion apparatus of claim 12, wherein the heat transfer suppressor is a resistor provided at the pattern for inhibiting heat transfer from the high temperature section to the low temperature section.

15. A power conversion apparatus, comprising:
a device of wide band gap semiconductor; and
a driver section for driving the device, wherein
the driver section is made of wide band gap semiconductor and is arranged in a single package together with the device, and
the package is thermally insulated from a peripheral component in the vicinity thereof.

16. The power conversion apparatus of any one of claims 1, 6, 10, and 15, wherein
the wide band gap semiconductor is SiC semiconductor.

* * * * *